US012592334B2

(12) United States Patent
Ahmed et al.

(10) Patent No.: US 12,592,334 B2
(45) Date of Patent: Mar. 31, 2026

(54) STACKED MAGNETIC INDUCTOR AND METHOD

(71) Applicant: Intel Corporation, Santa Clara, CA (US)

(72) Inventors: Numair Ahmed, Chandler, AZ (US); Kyu Oh Lee, Chandler, AZ (US); Sri Chaitra Jyotsna Chavali, Chandler, AZ (US); Vijaya Boddu, Pleasanton, CA (US); Krishna Bharath, Phoenix, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 982 days.

(21) Appl. No.: 17/531,954

(22) Filed: Nov. 22, 2021

(65) Prior Publication Data

US 2023/0162902 A1 May 25, 2023

(51) Int. Cl.
| | |
|---|---|
| *H01F 41/02* | (2006.01) |
| *H01F 27/02* | (2006.01) |
| *H01L 21/48* | (2006.01) |
| *H01L 23/49* | (2006.01) |
| *H01L 23/498* | (2006.01) |

(52) U.S. Cl.
CPC ....... *H01F 27/022* (2013.01); *H01F 41/0206* (2013.01); *H01L 21/4857* (2013.01); *H01L 21/486* (2013.01); *H01L 23/49822* (2013.01); *H01L 23/49827* (2013.01)

(58) Field of Classification Search
CPC .............. H01F 27/022; H01F 41/0206; H01L 21/4857; H01L 21/486; H01L 23/49822; H01L 23/49827
See application file for complete search history.

(56) References Cited

U.S. PATENT DOCUMENTS

| | | | | |
|---|---|---|---|---|
| 12,107,034 B2 * | 10/2024 | Ding | ................ | H01L 21/76898 |
| 2014/0159851 A1 * | 6/2014 | Mano | ................. | H01F 17/0013 |
| | | | | 336/200 |
| 2015/0213946 A1 * | 7/2015 | Mano | ..................... | H01F 17/04 |
| | | | | 336/200 |
| 2019/0189327 A1 * | 6/2019 | Kim | ..................... | H01F 41/041 |
| 2019/0272936 A1 * | 9/2019 | Zhang | .................... | H01F 27/24 |
| 2019/0274217 A1 * | 9/2019 | Zhang | ................. | H05K 3/0026 |
| 2019/0279806 A1 * | 9/2019 | Darmawikarta | .... | H01F 27/2804 |
| 2019/0287815 A1 * | 9/2019 | Xu | ........................... | H01F 41/24 |
| 2020/0058569 A1 * | 2/2020 | Cho | ................. | H01L 23/49822 |
| 2020/0118990 A1 * | 4/2020 | Xu | ..................... | H01L 23/5383 |
| 2021/0183562 A1 * | 6/2021 | Kawai | .................... | H01F 41/24 |
| 2023/0009751 A1 * | 1/2023 | Aoki | ................... | H05K 3/0094 |

\* cited by examiner

*Primary Examiner* — Malcolm Barnes

(74) *Attorney, Agent, or Firm* — Essential Patents Group, LLP

(57) ABSTRACT

An electronic device and associated methods are disclosed. In one example, the electronic device includes a package with integrated inductors. In selected examples, the package includes a core layer having a core thickness and through holes. The package further includes inductor structures within the through holes, such that an inductor structure has a length exceeding the core thickness.

23 Claims, 10 Drawing Sheets

STACKED MAGNETIC INDUCTOR AND METHOD

TECHNICAL FIELD

Embodiments described herein generally relate to embedded inductor structures for use in electronic devices such as computing systems.

BACKGROUND

As electronic devices have become more complex, the number of substrate layers used to build circuit boards has steadily increased. This results in increased capital expenditures to maintain product volumes. It is desired to have a method for using substrate materials in a way that reduces costs while maintaining or improving other mechanical properties of circuit boards.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As electronic devices have become more complex, the number of substrate layers needed to create circuit boards has increased, resulting in decreasing substrate yields. This has led to increasing capital expenditure requirements for the same product volumes. Inductor structures and semiconductor packages manufactured according to methods described herein may help reduce cost by replacing some of the buildup layers of a substrate with less expensive laminate layers.

Embodiments described herein use a disaggregated substrate architecture in which a center, monolithic core comprised of a low coefficient of thermal expansion (CTE) material is used for improved stiffness and other favorable mechanical properties relative to available substrates. For example, structures as described herein in accordance with embodiments may provide reduced warpage and improved strength relative to available substrates. Furthermore, by providing inductor structures that extend beyond the low-CTE core, and through at least some of the other laminate layers, power delivery is left unaffected. Inductor structures provided according to various embodiments may reduce insertion loss for high-speed input/output technologies in use today, including Peripheral Component Interconnect (PCI) Express, Ethernet, etc., that use high data rates of 32 gigabits/second, 64 gigabits/second, and higher.

Figure 1:
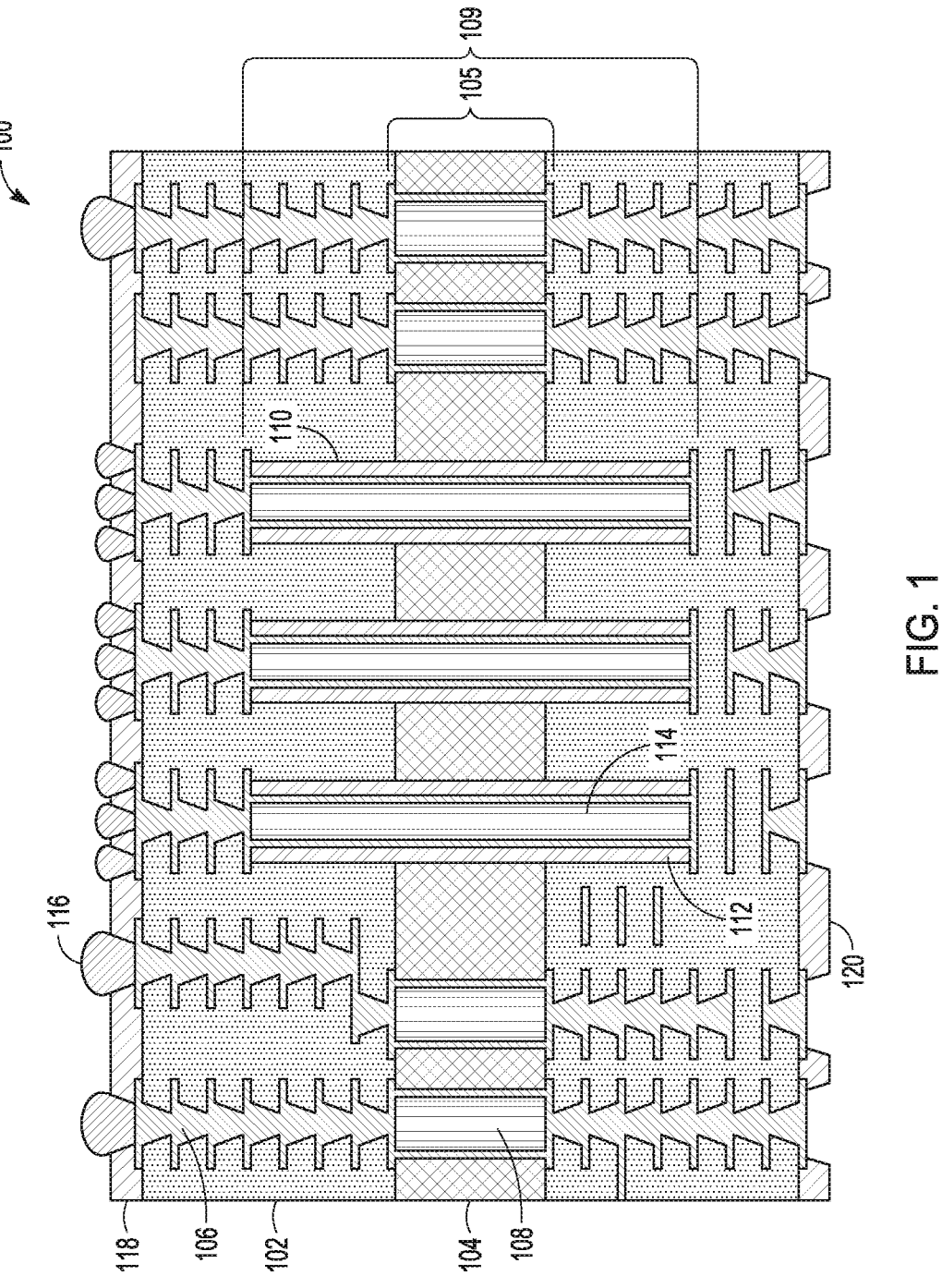
FIG. 1 shows a cross-sectional view of a hybrid core inductor structure in accordance with some example embodiments.

FIG. 1 shows a cross-sectional view of a hybrid core inductor structure 100 in accordance with some example embodiments. The hybrid core inductor structure 100 includes laminate substrate layers 102 and a core 104. The core 104 may be comprised of a low-CTE substance, for example a ceramic material and may have a core thickness 105. Stacked vias 106, traces, etc. may be formed through the electrically insulating layers to route the electrical signals of the dies (described in more detail later herein with respect to FIGS. 4A-4D) through the laminate substrate layers 102. The vias 106 can be formed as described in more detail later herein with respect to FIG. 3B.

Through holes, for example plated through holes 108, may be drilled through the core 104. Embodiments are not limited to plated through holes, however, and may include non-plated through holes. Inductor structures 110 may be formed in the stack up and may be taller than the core thickness 105. For example, the inductor structures 110 may have a length 109. The inductor structures 110 may include coaxial magnetic inductor structures although embodiments are not limited thereto. Each inductor structure 110 may comprise a magnetic material surrounding a conductive material, the conductive material shaped in cylinders 114. Solder balls 116 or other types of contacts may be provided for connection to other die, bridges, etc. (e.g., portions of a patch), including embedded multi-die interconnect bridges as described later herein with respect to FIGS. 4A-4D. Solder resist (SR) processing and surface finish (SF) plating 118 may be applied.

The desirable mechanical properties of a cored substrate such a low CTE and high stiffness are retained by including core 104 within the hybrid core structure 100. The hybrid core structure further includes the inductor structure 110 but, rather than being limited to a height within the core 104, the inductor structure 110 extends a greater length than the height of the inner core, up to a height of the package substrate, to retain power delivery benefits. In addition, because the core 104 is kept thinner than in previous structures, core drilling is minimized or reduced relative to structures including a thicker core.

Figure 2:
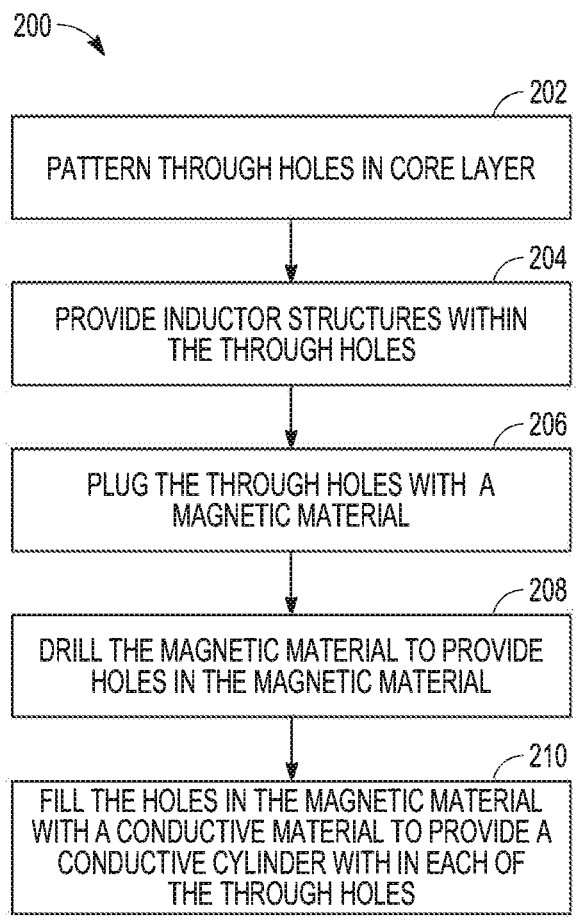
FIG. 2 shows a flow diagram of a method of manufacture of a hybrid core inductor structure in accordance with some example embodiments.

FIG. 2 shows a flow diagram of a method 200 of manufacture of a hybrid core inductor structure in accordance with some example embodiments. The resulting inductor package may be incorporated in any package as described above. In operation 202, a plurality of through holes 112 are patterned in a core layer 104 having a core thickness 105. The core layer 104 may be comprised of a material having a low coefficient of thermal expansion (CTE), for example, a woven glass fabric embedded in an epoxy resin. The CTE is targeted to best balance the CTE between the package substrate and that of the silicon chip being attached to it. In examples, the CTE can be about 2-15 ppm per degree Celsius. In operation 204, a plurality of inductor structures 110 is provided within the through holes 112, such that an inductor structure 110 of the plurality of inductor structures has a length 109 exceeding the core thickness 105.

The method 200 continues with operation 206 with plugging the through holes 112 with a magnetic material. The method 200 continues with operation 208 with drilling the magnetic material to provide holes in the magnetic material. Any suitable drilling technique, e.g., laser drilling, may be used to form the holes in the magnetic material. Method 200 continues with operation 210 with filling the holes in the magnetic material with a conductive material to provide a conductive cylinder 114 within each of the through holes 112. The conductive material may include copper.

The method 200 may further include patterning a second plurality of through holes in the core layer and disposing a conductive material into the second plurality of through holes to form a plurality of plated through holes 108. The method 200 may further include disposing a first conductive layer over the plurality of plated through holes 108 and disposing a second conductive layer below the plurality of plated through holes 108.

The method 200 may further include providing at least a first laminate layer 102 over the first conductive layer and at least a second laminate layer 102 under the second conductive layer. The first laminate layer 102 and the second laminate layer 102 may have a CTE higher than a CTE of the core layer 104. Providing at least the first laminate layer 102 may comprise providing at least one prepreg lamination layer over the first conductive layer or under the second conductive layer. The prepreg lamination layer 102 may have a CTE higher than the CTE of the core layer. The method 200 may further comprise providing solder balls 116 over at least one of the plurality of inductor structures 110. The method 200 may further comprise shorting together two neighboring inductor structures 110 to provide a higher-inductance inductor structure.

Figure 3A:
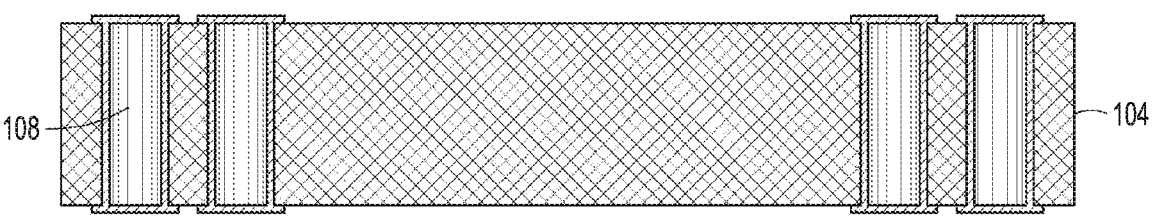
FIGS. 3A-3G show intermediate steps of a method of manufacture of an inductor package that includes integrated inductors in accordance with some example embodiments.

FIGS. 3A-3G show intermediate steps of a method of manufacture of an inductor package that includes integrated inductors in accordance with some example embodiments. FIG. 3A shows that through holes 108 are formed in a low-CTE core 104 using a mechanical drilling process or laser drilling.

Figure 3B:
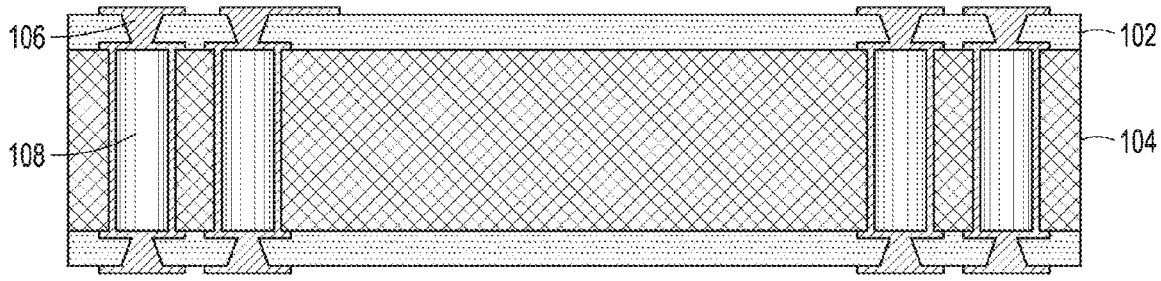

FIG. 3B shows layers 102 being formed. Layers 102 can be formed on a patterned metal layer, e.g., a conductive layer (not shown in FIG. 3B) and can be comprised of laminate substrate. Layers 102 may be comprised of prepreg lamination material. For example, laminate substrate layers 102 may be comprised of materials such as, for example, poly-tetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. The laminate substrate layers 102 may be composed of other suitable materials in other embodiments. Layers 102 may be each cured before applying subsequent layers 102. In embodiments, the patterned metal layer may be formed in any manner known in the art. For example, the patterned metal layer may be a build-up layer formed with a semi-additive process (SAP).

Vias 106 may be created, and plating may be applied. Plating can be formed in an electroless plating process, for example in an electroless copper (Cu) plating process. Vias 106 may be formed by providing a laser-drilled opening in a respective substrate layer 102. A conductive material such as a metal is deposited in the opening to form a via 106. The conductive material of the via 106 may include a metal such as, for example, copper (Cu), nickel (Ni), palladium (Pd), gold (Au), silver (Ag), or combinations thereof. In some embodiments a photosensitive layer (not shown in FIG. 3B) that is amenable to masking, patterning, and etching can be applied, and vias can be drilled through this photosensitive layer.

Etching can also be performed in this and subsequent steps for manufacture of an inductor package in accordance with some example embodiments. For example, a metallic seed layer (not shown in FIG. 3B) can be disposed on a respective substrate layer 102. An etching process may remove exposed portions of the metallic seed layer to expose an underlying dielectric layer of the respective substrate layer 102.

Figure 3C:
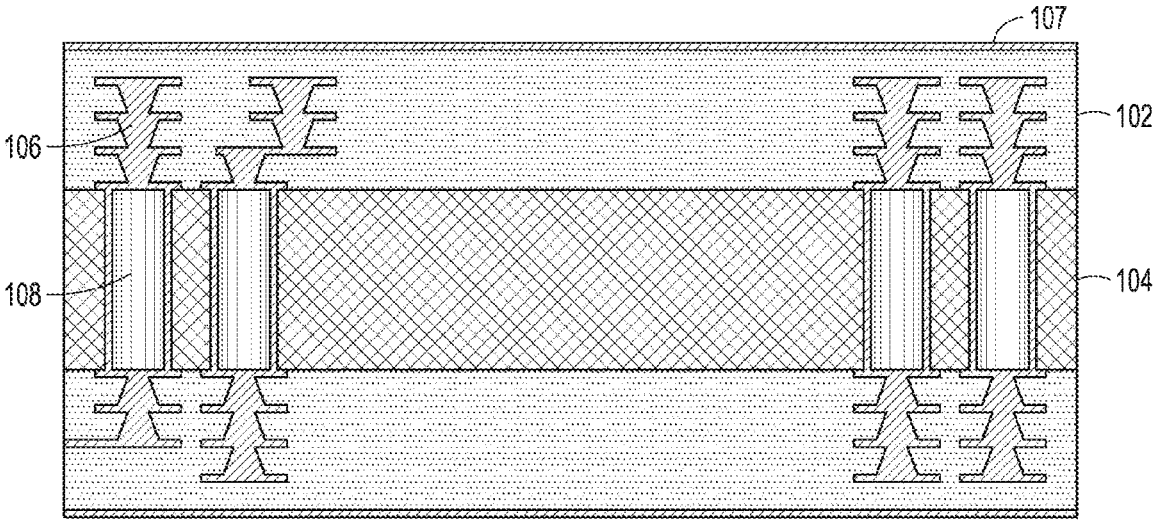
Figure 3D:
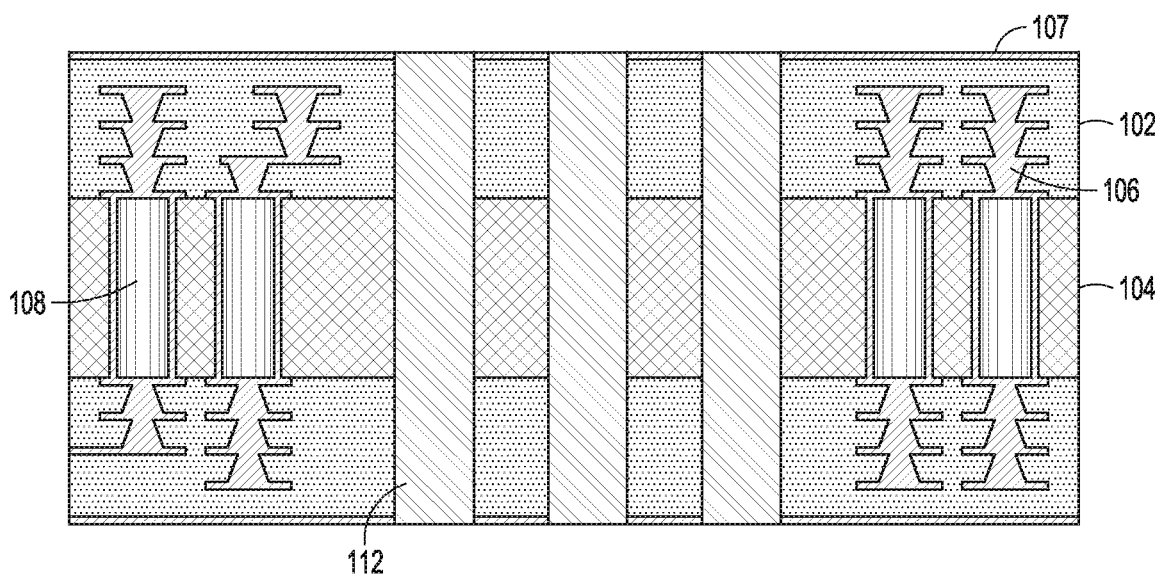

FIG. 3C shows additional layers 102 being formed. Additional layers 102 can be added using a same or similar process as described with respect to FIG. 3B. Vias 106 may be added at each layer 102, for example to a copper-plated layer 107. FIG. 3D shows through holes 112 being drilled. The holes 112 may be drilled and filled with a magnetic material, for example magnetic paste. The magnetic paste may
include a polymer resin impregnated with particles of the magnetic material. The magnetic material may comprise an alloy of at least one of iron, nickel, and cobalt.

Figure 3E:
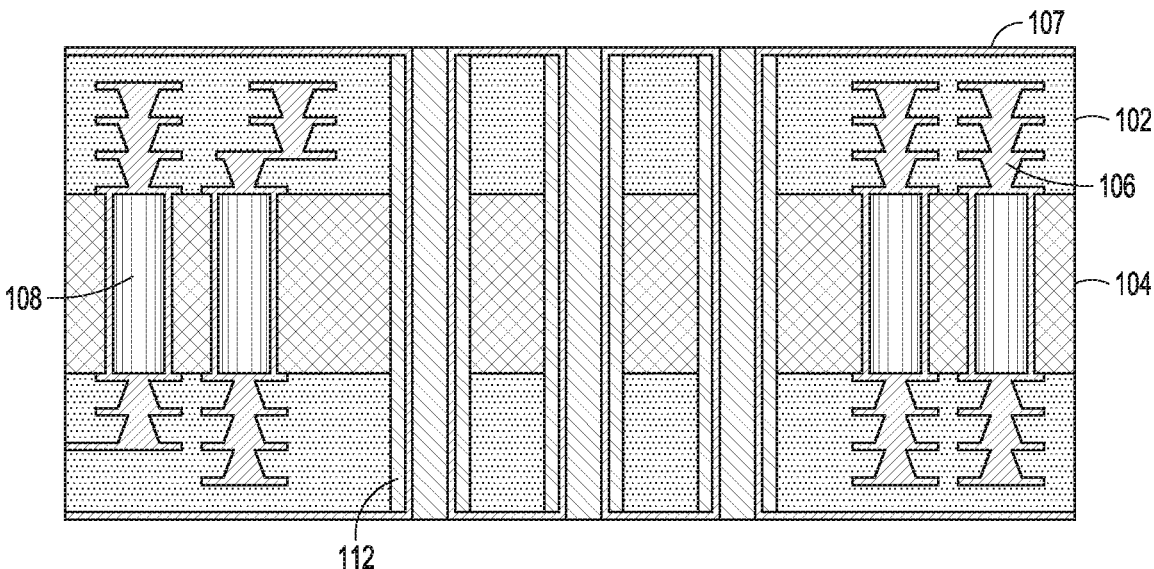
Figure 3F:
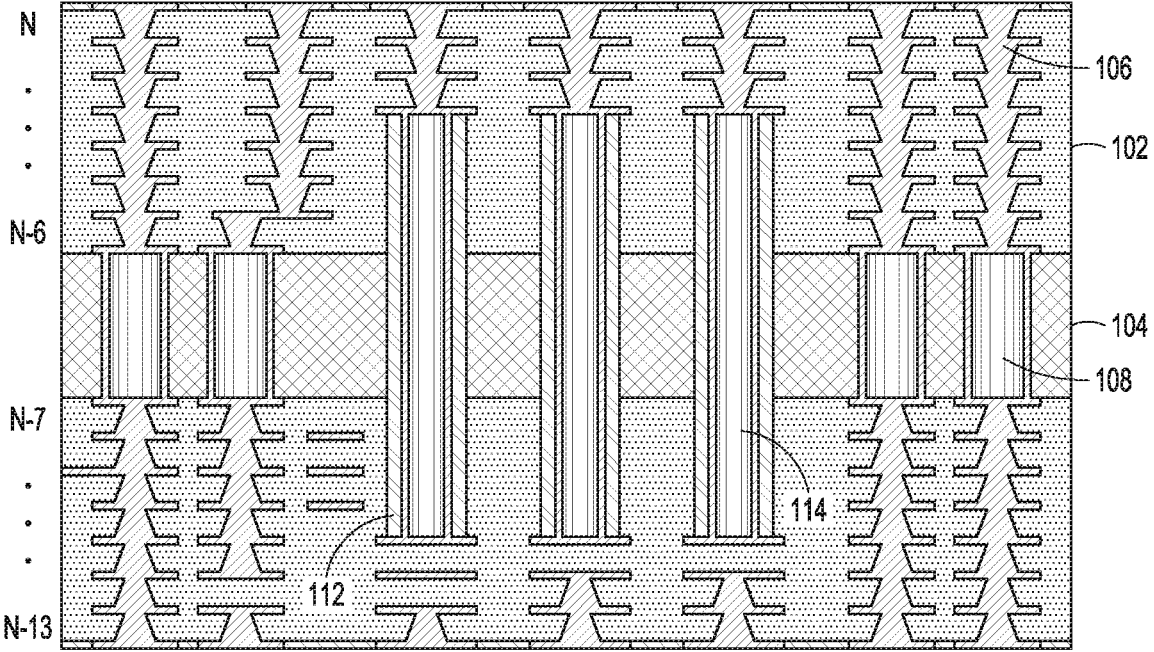

FIG. 3E shows further drilling and plating within the through holes 112. FIG. 3F shows the conductors being provided in through holes 112 to provide inductor structures. Layers 102 are built in N layers, e.g., N to N-13 layers. While fourteen layers are shown, however, it will be appreciated that packages in accordance with some embodiments may include any number of layers.

Figure 3G:
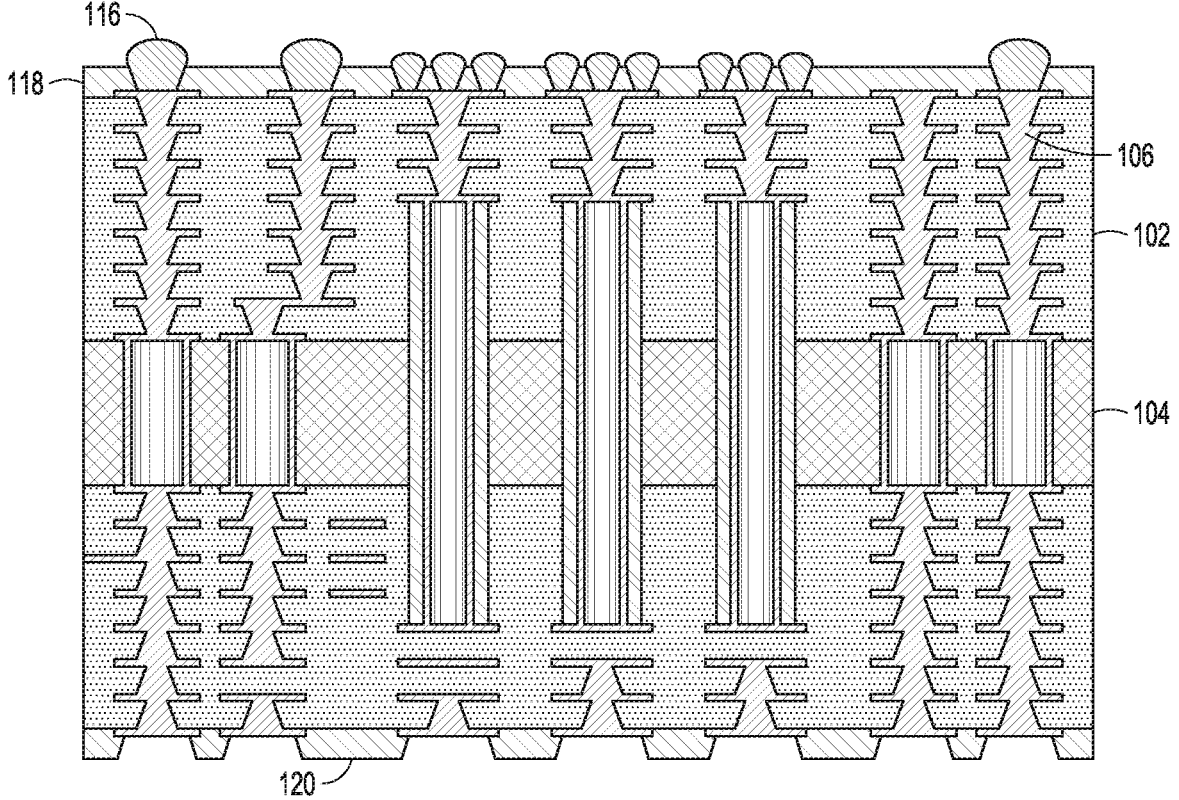

FIG. 3G shows solder ball 116 attachment, as may be performed using a solder resist (SR) process. In at least this operation, surface finish (SF) plating 118 may be added.

FIGS. 4A-4D shows intermediate steps of assembling an architecture including a semiconductor package in accordance with some example embodiments. The architecture may be assembled in a unit level or panel level assembly by assembling a patch assembly to a hybrid core inductor structure, e.g., a hybrid core inductor structure as described above with respect to FIG. 2 and FIGS. 3A-3G.

Figure 4A:
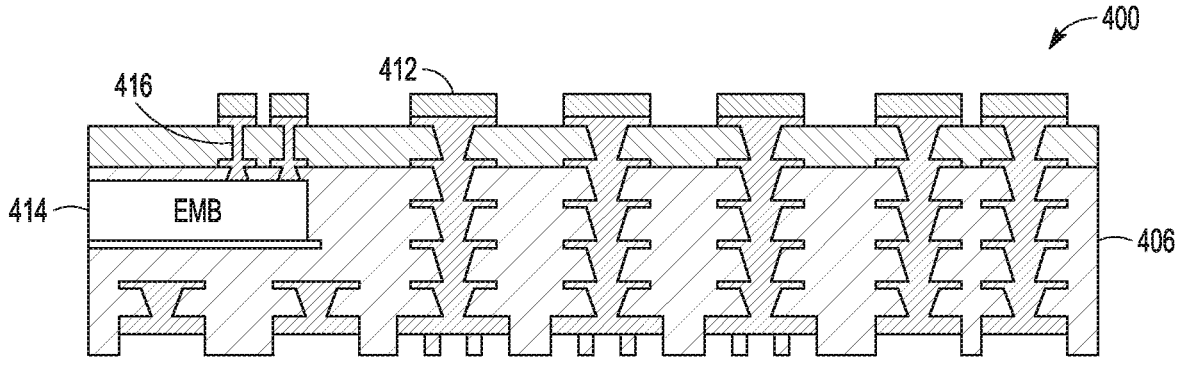
FIGS. 4A-4D shows intermediate steps of assembling an architecture including a semiconductor package in accordance with some example embodiments.

FIG. 4A depicts a patch 400. In some embodiments, the patch 400 does not include a core portion, e.g., the patch 400 does not include a core portion similar to core 104 described earlier herein, while in other embodiments (e.g., patch 402 illustrated in FIG. 4D) the patch does include a core portion 404. In these and other embodiments, the patch 400 includes patch substrate 406 comprised of layers of other than a laminate material such as that used in layers 102 described earlier herein. For example, in some embodiments, the patch substrate 406 may be comprised of layers of an epoxy-based laminate substrate such as, for example, Ajinomoto Build-up Film (ABF). The electrically insulative material may include other suitable materials in other embodiments.

A bridge interconnect structure (hereinafter "bridge 414") may be embedded in the patch substrate 406. The bridge 414 may be configured to route electrical signals between a die 408 (FIG. 4B) and other dies (not shown in FIG. 4B) through die interconnects 416 that are coupled with contacts of the bridge 414. The bridge 414 may also include high density electrical routing features such as, for example, traces (not shown) or other suitable features that provide an electrical pathway for electrical signals between the die 408 and other dies (not shown in FIG. 4B) through the bridge 414. The bridge 414 may provide routing for electrical signals such as, for example, input/output (I/O) signals and/or power/ground associated with operation of the die 408 and other dies. In some embodiments, the die 408 may be a processor such as a central processing unit (CPU) or memory. In other embodiments, the die 408 may include, or be a part of a processor, memory, system-on-chip (SoC), ASIC or may be configured to perform another suitable function. The bridge 414 may be composed of a variety of suitable materials including, for example, semiconductor materials or glass. In one embodiment, the bridge 414 may be composed of silicon and may be in the form of a die.

The bridge 414 can be placed within a bridge cavity formed within the patch substrate 406. In embodiments, the bridge cavity may be formed by thermal, mechanical, laser ablation or etching processes. In some embodiments, dielectric within one or more layers of the patch substrate 406 can be removed in the region of the bridge cavity to expose conductive layers of the patch substrate 406. In other embodiments, the bridge cavity may be left open during fabrication of the build-up layers of the patch substrate 406. In some embodiments, the bridge cavity may be formed through the dielectric of patch substrate 406 using a patterning process. For example, dielectric may be composed of a photosensitive material that is amenable to masking, patterning and etching, and/or develop processes.

In embodiments, the bridge 414 may include a bridge substrate composed of glass or a semiconductor material, such as high resistivity silicon (Si) having electrical routing interconnect features formed thereon, to provide a chip-to-chip connection between dies. The bridge 414 may be mounted on a conductive layer 415 using an adhesive in some embodiments. The material of the adhesive may include any suitable adhesive configured to withstand processes associated with fabrication of the patch substrate 406. In embodiments, chemical treatments, such as, for example, a copper roughing technique may be applied to improve adhesion between the bridge 414 and the conductive layer 415. In embodiments, the bridge 414 may include die contacts such as pads, protruding above the surface of the bridge substrate, and configured to serve as connection points for routing of electrical signals to and from the bridge 414.

Figure 4B:
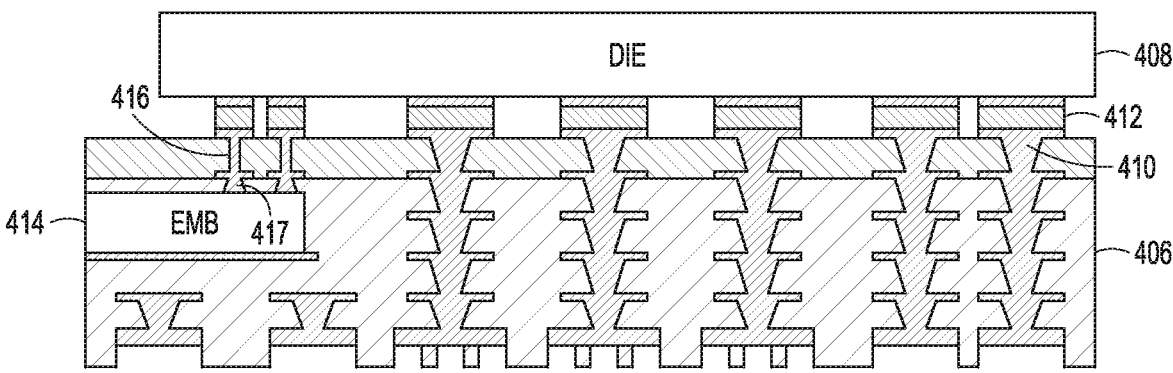

FIG. 4B illustrates addition of a die 408 coupled with patch substrate 406 using first-level interconnect (FLI) structures (e.g., pillars 410 and solderable material 412). Together, the pillars 410 and solderable material 412 may be referred to hereinafter as "die interconnects."

The die interconnects 416 may include, for example, pillars and/or solderable material. The pillars and/or solderable material may form high density interconnects such as, for example, bumps or pillars that provide a pathway for communication between the die 408 and other dies (not shown in the figures) through the bridge 414. The die interconnects 416 including the pillars may also be referred to as "bridge-to-die interconnects."

In some embodiments, the die interconnects 416 extend through electrically insulative material of the patch substrate 406. In some embodiments, the electrically insulative material may include material (e.g., epoxy-based material) of one or more build-up layers that at least partially encapsulate the bridge 414. In some embodiments, the electrically insulative material disposed between the bridge 414 and the patch substrate 406 is an electrically insulative layer (e.g., build-up layer) of the patch substrate 406. In some embodiments, individual contacts 417 on the bridge 414 may be coupled with corresponding die interconnects 416 of the die 408. The contacts 417 may include, for example, individual pads that correspond with individual die interconnects 416. Electrically conductive material can be deposited on exposed surfaces of the patch substrate 406 to form interconnects of an outermost layer of the patch substrate 406.

Figure 4C:
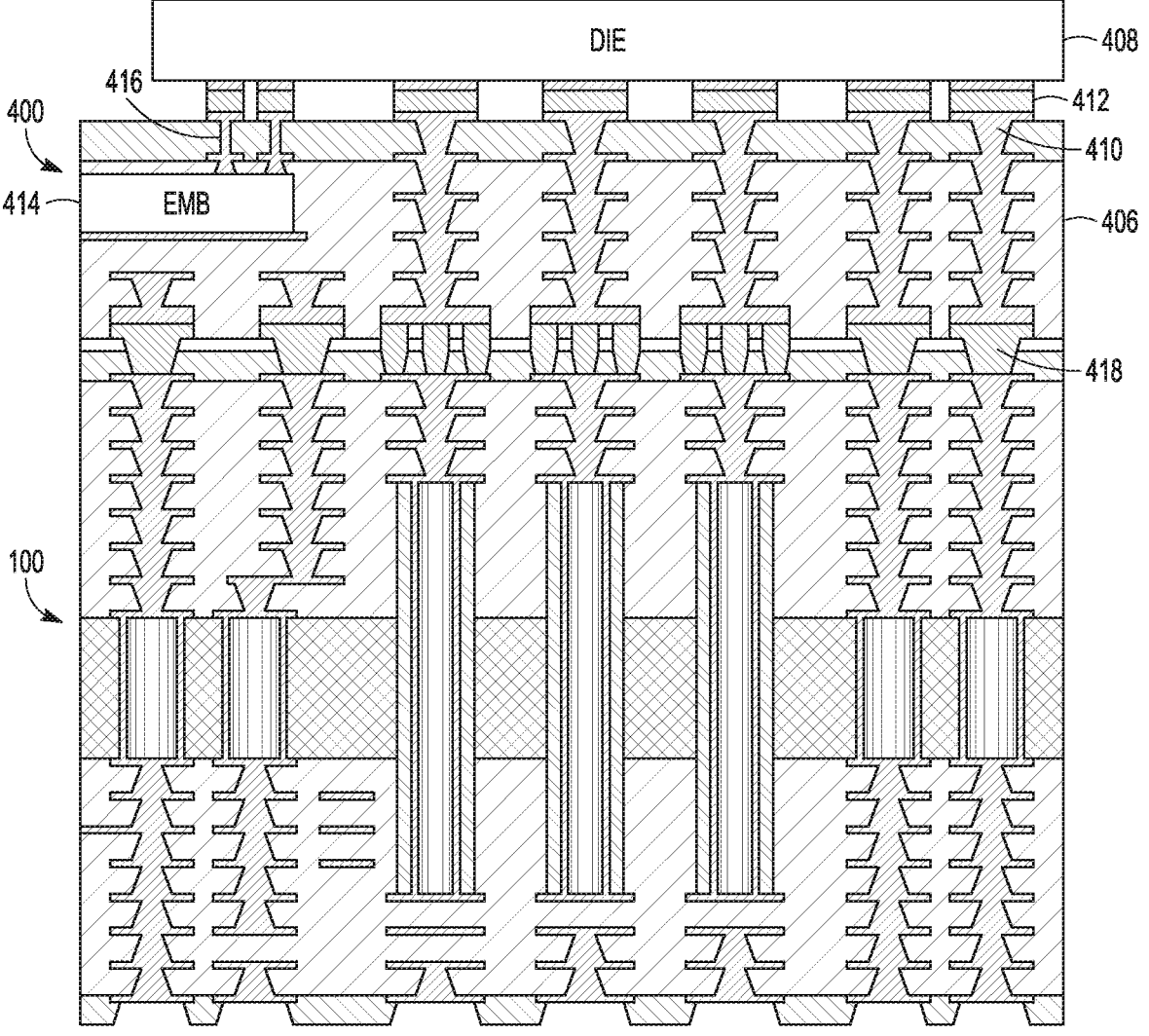

FIG. 4C illustrates patch 400 assembly onto the hybrid core inductor structure 100. The hybrid core inductor structure 100 may include structures as described above with respect to FIG. 1 and FIGS. 3A-3G. The patch 400 may be coupled with the hybrid core inductor structure 100 using second-level interconnect (SLI) structures (e.g., solder balls 418). The FLI structures and/or the SLI structures may include other suitable structures including additional or alternative structures than depicted in other embodiments. Hereinafter, the SLI structures may be referred to as "package interconnects." Solder balls 418 may be arranged in a ball-grid array (BGA) configuration and may be coupled to one or more pads on the patch substrate 406 and to one or more pads on the hybrid core inductor structure 100 to form corresponding solder joints that are configured to further route the electrical signals of the die 408 between the patch substrate 406 and the hybrid core inductor structure 100. The pads may be composed of any suitable material such as metal including, for example, nickel (Ni), palladium (Pd), gold (Au), silver (Ag), copper (Cu), or combinations thereof. Other suitable techniques to physically and/or electrically couple patch substrate 406 with hybrid core inductor structure 100 may be used in other embodiments. For example, in some embodiments, package interconnects may include land-grid array (LGA) structures or other suitable structures.

Some die interconnects 420 include pillars configured to route electrical signals between die 408 and the hybrid core inductor structure 100. For example, the pillars may be electrically coupled with other electrical routing features or through the patch substrate 406. The die interconnects 420 may be composed of any suitable electrically conductive material including, for example, a metal such as copper. The pillars of the die interconnects 420 may be formed by, for example, a laser drilling technique in some embodiments. Further, in some embodiments, no pad structure intervenes between the die interconnects 420 and the die 408, which may provide a die interconnect referred to as a "pad-less pillar." In an embodiment where solderable material 412 is disposed on the die interconnects 420, no pad structure intervenes between the pillar of the die interconnect 420 and the solderable material 412.

Figure 4D:
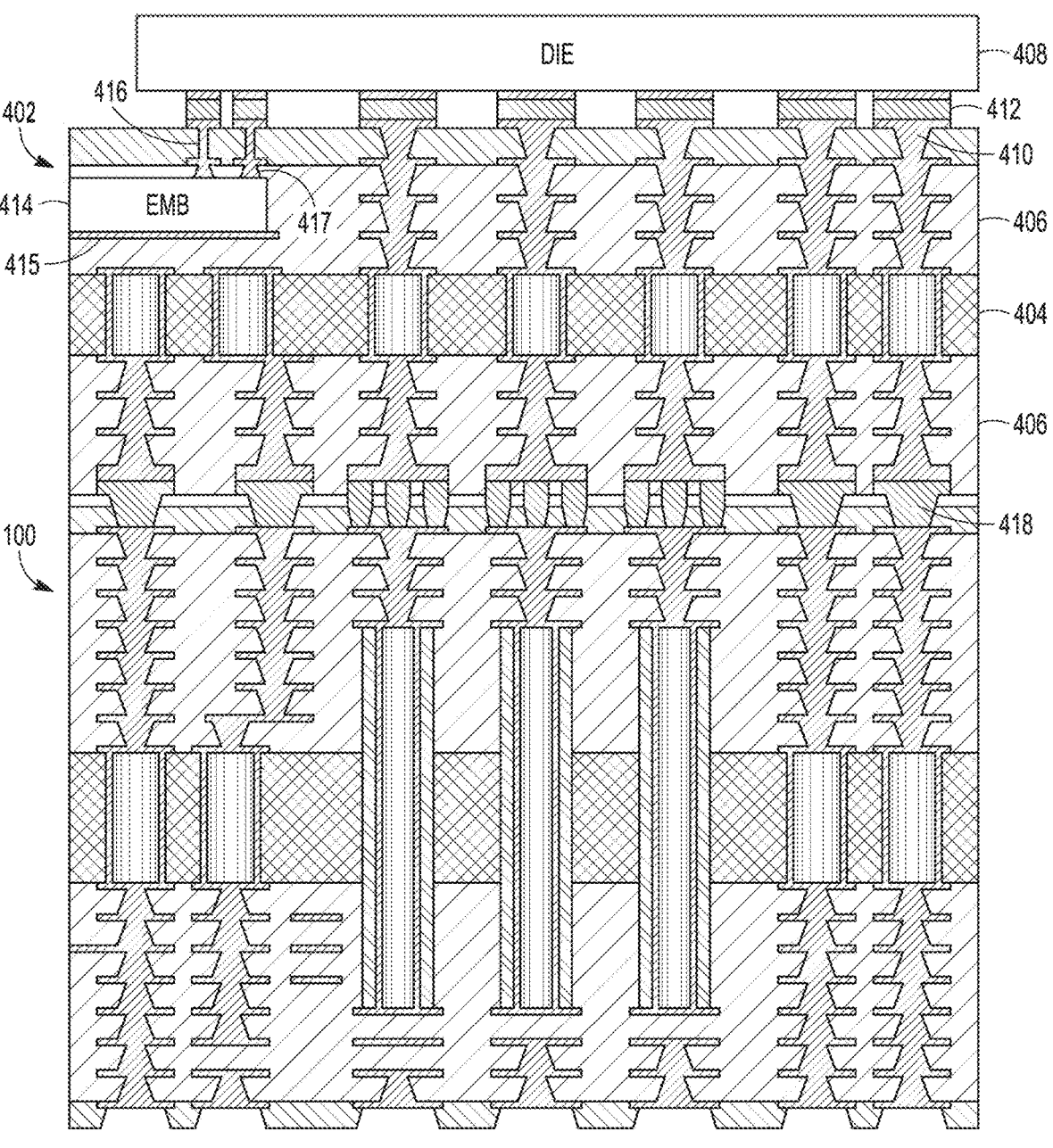

FIG. 4D includes an alternative patch 402 assembly, in accordance with some embodiments. Patch 402 includes core 404, which may comprise stiff material similar to core 104 described earlier herein. Otherwise, patch 402 includes similar components as patch 400 described earlier herein.

By providing inductor structures according to embodiments described above, manufacturing costs can be reduced by replacing some of the buildup layers of a substrate with less expensive laminate layers. Structures can also maintain good mechanical properties, resulting in improved strength and reduced warpage.

Figure 5:
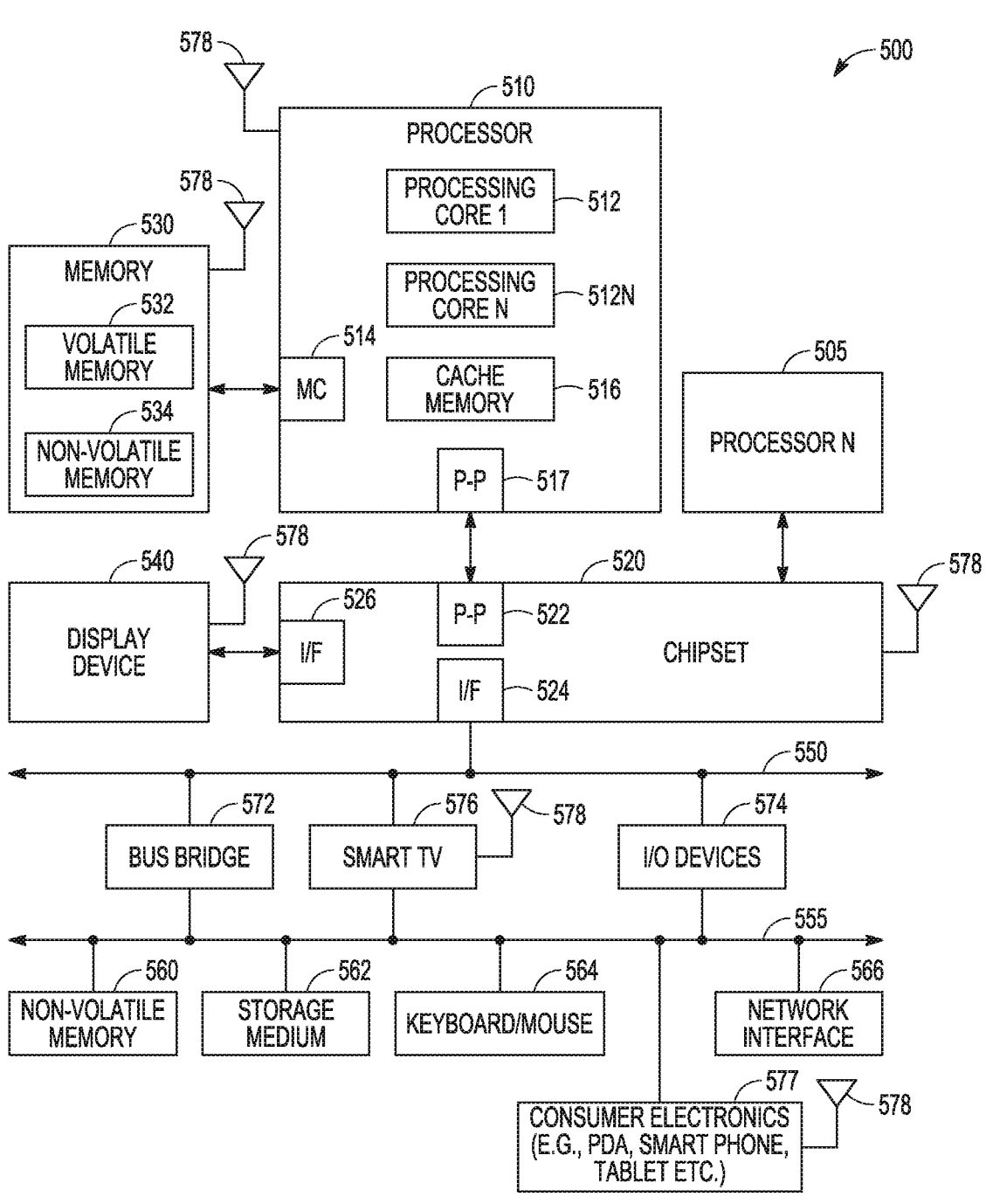
FIG. 5 shows a system that may incorporate an electronic device having a hybrid core inductor structure, in accordance with some example embodiments.

FIG. 5 illustrates a system level diagram, depicting an example of an electronic device (e.g., system) that can include a hybrid core inductor structure and/or methods described above. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 500 includes a system on a chip (SOC) system.

In one embodiment, processor 510 has one or more processor cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 can be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 can also be coupled to a wireless antenna 578 to communicate with any device configured to transmit and/or receive wireless signals. In one embodiment, an interface for wireless antenna 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random-Access Memory (SDRAM), Dynamic Random-Access Memory (DRAM), RAMBUS Dynamic Random-Access Memory (RDRAM), and/or any other type of random-access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 can also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the example system, interfaces 517 and 522 operate in accordance with a PtP communication protocol such as the Intel® QuickPath Interconnect (QPI) or the like. In other embodiments, a different interconnect can be used.

In some embodiments, chipset 520 is operable to communicate with processor 510, 505, display device 540, and other devices, including a bus bridge 572, a smart TV 576, I/O devices 574, nonvolatile memory 560, a storage medium (such as one or more mass storage devices) 562, a keyboard/mouse 564, a network interface 566, and various forms of consumer electronics 577 (such as a PDA, smart phone, tablet etc.), etc. In one embodiment, chipset 520 couples with these devices through an interface 524. Chipset 520 can also be coupled to a wireless antenna 578 to communicate with any device configured to transmit and/or receive wireless signals. In one example, any combination of components in a chipset can be separated by a continuous flexible shield as described in the present disclosure.

Chipset 520 connects to display device 540 via interface 526. Display device 540 can be, for example, a liquid crystal display (LCD), a light emitting diode (LED) array, an organic light emitting diode (OLED) array, or any other form of visual display device. In some embodiments of the example system, processor 510 and chipset 520 are merged into a single SOC. In addition, chipset 520 connects to one or more buses 550 and 555 that interconnect various system elements, such as I/O devices 574, nonvolatile memory 560, storage medium 562, a keyboard/mouse 564, and network interface 566. Buses 550 and 555 can be interconnected together via a bus bridge 572.

In one embodiment, storage medium 562 includes, but is not limited to, a solid-state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a PCI Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks can be integrated within a single semiconductor circuit or can be implemented using two or more separate integrated circuits. For example, although cache memory 516 is depicted as a separate block within processor 510, cache memory 516 (or selected aspects of 516) can be incorporated into processor core 512.

To better illustrate the method and apparatuses disclosed herein, a non-limiting list of embodiments is provided here:

Example 1 includes a package with integrated inductors. The package comprises a core layer having a core thickness and a plurality of through holes; and a plurality of inductor structures within the plurality of through holes, such that an inductor structure of the plurality of inductor structures has a length exceeding the core thickness.

Example 2 includes the package of example 1, wherein the core layer comprises woven glass fabric embedded in an epoxy resin.

Example 3 includes the package of any one of examples 1-2, wherein the core layer comprises a ceramic material.

Example 4 includes the package of any one of examples 1-3, further comprising at least one additional layer on the core layer, the at least one additional layer comprising a different material than a material of the core layer.

Example 5 includes the package of example 4, wherein the plurality of inductor structures extends through the at least one additional layer.

Example 6 includes the package of example 5, further comprising a plurality of through hole vias in the core layer; a first conductive layer over the plurality of through hole vias; and a second conductive layer below the plurality of through hole vias.

Example 7 includes the package of any one of examples 1-6 wherein the plurality of inductor structures comprises coaxial magnetic inductor structures.

Example 8 includes the package of any one of examples 1-7, wherein the plurality of inductor structures comprises a magnetic material surrounding a conductive material, the conductive material shaped in cylinders.

Example 9 includes the package of example 8, wherein the magnetic material comprises magnetic paste.

Example 10 includes the package of example 9, wherein the magnetic paste includes a polymer resin impregnated with particles of the magnetic material, the magnetic material comprising at least one of iron, nickel, and cobalt.

Example 11 includes a method to form a package with integrated conductors. The method comprises patterning a plurality of through holes in a core layer having a core thickness, the core layer comprised of woven glass fabric embedded in an epoxy resin; and providing a plurality of inductor structures within the plurality of through holes, such that an inductor structure of the plurality of inductor structures has a length exceeding the core thickness.

Example 12 includes the package of example 11, further comprising plugging the plurality of through holes with a magnetic material; and drilling the magnetic material to provide holes in the magnetic material.

Example 13 includes the subject matter of example 12, further comprising filling the holes in the magnetic material with a conductive material to provide a conductive cylinder within each of the plurality of through holes.

Example 14 includes the subject matter of example 13, wherein the conductive material includes copper.

Example 15 includes the subject matter of any one of examples 11-14, further comprising patterning a second plurality of through holes in the core layer; and disposing a conductive material into the second plurality of through holes to form a plurality of through hole vias.

Example 16 includes the subject matter of example 15, and further comprising disposing a first conductive layer over the plurality of through hole vias; and disposing a second conductive layer below the plurality of through hole vias.

Example 17 includes the subject matter of example 16, further comprising providing at least a first laminate layer over the first conductive layer and at least a second laminate layer under the second conductive layer, wherein the first laminate layer and the second laminate layer have a CTE higher than a CTE of the core layer.

Example 18 includes the subject matter of example 17, wherein providing at least the first laminate layer comprises providing at least one prepreg lamination layer over the first conductive layer or under the second conductive layer, wherein the at least one prepreg lamination layer has a CTE higher than the CTE of the core layer.

Example 19 includes the subject matter of example 17, further comprising providing solder balls over at least one of the plurality of inductor structures.

Example 20 includes the subject matter of any one of examples 11-19, further comprising shorting together two neighboring inductor structures to provide a higher-inductance inductor structure.

Example 21 is a semiconductor package. The semiconductor package comprises a package substrate; and an inductor package coupled to the package substrate, the inductor package including a core layer having a core thickness and a plurality of through holes, the core layer, and a plurality of inductor structures within the plurality of through holes, such that an inductor structure of the plurality of inductor structures has a length exceeding the core thickness.

Example 22 includes the subject matter of example 21, wherein the inductor package includes at least one laminate layer wherein the core layer has a stiffness higher than a stiffness of the at least one laminate layer.

Example 23 includes the subject matter of any one of examples 21-22, wherein the core layer comprises woven glass fabric embedded in an epoxy resin.

Example 24 includes the subject matter of any one of examples 21-23, wherein the plurality of inductor structures comprises coaxial magnetic inductor structures.

Throughout this specification, plural instances can implement components, operations, or structures described as a single instance. Although individual operations of one or more methods are illustrated and described as separate operations, one or more of the individual operations can be performed concurrently, and nothing requires that the operations be performed in the order illustrated. Structures and functionality presented as separate components in example configurations can be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

What is claimed is:

1. A package structure with integrated inductors, comprising:
   a core layer having a core thickness;
   a plurality of laminate substrate layers on the core layer, the plurality of laminate substrate layers having a higher coefficient of thermal expansion (CTE) than a CTE of the core layer, and a plurality of via layers within the laminate substrate layers, the plurality of via layers having not fewer than three via layers;
   a plated through hole extending through the core layer and coupled to a lower-most one of the plurality of via layers adjacent the core layer; and
   an inductor comprising a magnetic material surrounding a conductive material, the magnetic material and the conductive material each having a length exceeding the core thickness, the inductor extending through the core layer and a portion of the plurality of laminate substrate layers beyond the lower-most one of the plurality of via layers to couple to an upper-most one of the plurality of via layers distal the core layer such that the length of each of the magnetic material and the conductive material extends beyond the lower-most one of the plurality of via layers and at least one via layer between the lower-most one of the plurality of via layers and the upper-most one of the plurality of via layers.

2. The package structure of claim 1, wherein the core layer comprises woven glass fabric embedded in an epoxy resin.

3. The package structure of claim 1, wherein the core layer comprises a ceramic material.

4. The package structure of claim 1, further comprising:
   a plurality of second laminate substrate layers on the core layer and opposite the core layer from the plurality of laminate substrate layers, and a plurality of second via layers within the second laminate substrate layers, the plurality of second via layers having not fewer than three via layers.

5. The package structure of claim 4, wherein the inductor extends beyond a lower-most one of the plurality of second via layers to couple to an upper-most one of the plurality of second via layers such that the length of each of the magnetic material and the conductive material extends beyond the lower-most one of the plurality of second via layers and at least one second via layer between the lower-most one of the plurality of second via layers and the upper-most one of the plurality of second via layers.

6. The package structure of claim 5, wherein the plated through hole is coupled to the lower-most one of the plurality of second via layers.

7. The package structure of claim 1, wherein the inductor comprises a coaxial magnetic inductor.

8. The package structure of claim 1, wherein the conductive material is a cylinder.

9. The package structure of claim 1, wherein the magnetic material comprises magnetic paste.

10. The package structure of claim 9, wherein the magnetic paste comprises a polymer resin impregnated with particles of the magnetic material, the magnetic material comprising at least one of iron, nickel, and cobalt.

11. The package structure of claim 1, further comprising:
    a die coupled to the plurality of via layers.

12. The package structure of claim 11, further comprising:
    a bridge within the laminate substrate layers.

13. A package structure with integrated inductors, comprising:
    a core layer having a core thickness, the core layer comprising a ceramic material;
    laminate substrate layers on the core layer, the laminate substrate layers having a higher coefficient of thermal expansion (CTE) than a CTE of the core layer, and not fewer than three via layers within the laminate substrate layers, the via layers comprising a lower-most via layer adjacent the core layer, an upper-most via layer distal the core layer, and one or more middle via layers between the lower-most via layer and the upper-most via layer;
    a plated through hole extending through the core layer and coupled to a bottom of the lower-most via layer; and
    an inductor comprising a magnetic material surrounding a conductive material, the magnetic material and the conductive material each having a length exceeding the core thickness, the inductor extending through the core layer and beyond the lower-most via layer and the one or more middle via layers to couple to a bottom of the upper-most via layer such that the length of each of the magnetic material and the conductive material extends beyond the lower-most via layer and the one or more middle via layers.

14. The package structure of claim 13, further comprising:
    second laminate substrate layers on the core layer and opposite the core layer from the laminate substrate layers, and a plurality of second via layers within the second laminate substrate layers.

15. The package structure of claim 14, wherein the second via layers comprise a lower-most second via layer adjacent the core layer, an upper-most second via layer distal the core layer, and one or more middle second via layers between the lower-most second via layer and the upper-most second via layer.

16. The package structure of claim 15, wherein the inductor extends beyond the lower-most second via layer and the one or more middle second via layers to couple to the upper-most second via layer.

17. The package structure of claim 16, wherein the plated through hole is coupled to the lower-most second via layer.

18. The package structure of claim 13, wherein the inductor comprises a coaxial magnetic inductor.

19. The package structure of claim 13, wherein the conductive material is a cylinder.

20. The package structure of claim 13, wherein the magnetic material comprises magnetic paste.

21. The package structure of claim 20, wherein the magnetic paste comprises a polymer resin impregnated with particles of the magnetic material, the magnetic material comprising at least one of iron, nickel, and cobalt.

22. The package structure of claim 13, further comprising:

a die coupled to the via layers.

23. The package structure of claim 22, further comprising:

a bridge within the laminate substrate layers.

\* \* \* \* \*